US011233513B2

(12) United States Patent
Tsai et al.

(10) Patent No.: US 11,233,513 B2
(45) Date of Patent: Jan. 25, 2022

(54) REFERENCE VOLTAGE BUFFER WITH SETTLING ENHANCEMENT

(71) Applicant: MEDIATEK INC., Hsin-Chu (TW)

(72) Inventors: Hung-Chieh Tsai, Hsinchu (TW); Sheng-Hui Liao, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 17/065,526

(22) Filed: Oct. 8, 2020

(65) Prior Publication Data

US 2021/0135673 A1    May 6, 2021

Related U.S. Application Data

(60) Provisional application No. 62/930,696, filed on Nov. 5, 2019.

(51) Int. Cl.
*G05F 1/10* (2006.01)
*G05F 3/02* (2006.01)
*H03K 19/0185* (2006.01)
*G05F 3/24* (2006.01)

(52) U.S. Cl.
CPC ....... *H03K 19/018521* (2013.01); *G05F 3/24* (2013.01)

(58) Field of Classification Search
CPC ........... G05F 3/262; G05F 3/265; G05F 3/30; G05F 3/205; G11C 5/147
USPC .................................................. 327/538–543
See application file for complete search history.

(56) References Cited

U.S. PATENT DOCUMENTS

| 6,677,809 | B2* | 1/2004 | Perque | .................... G05F 1/465 327/541 |
| 7,204,638 | B2* | 4/2007 | Hsu | .......................... G01K 7/01 327/513 |
| 7,746,164 | B2* | 6/2010 | Ogiwara | ................. G05F 1/465 327/541 |
| 7,924,087 | B2 | 4/2011 | Tu et al. | |

(Continued)

FOREIGN PATENT DOCUMENTS

| CN | 108319319 A | 7/2018 |
| TW | 200632612 | 9/2006 |

(Continued)

OTHER PUBLICATIONS

Larry Singer, "A 12b 65M Sample/s CMOS ADC with 82dB SFDR at 120MHz", 2000 IEEE International Solid-State Circuits Conferenc, 2000.

(Continued)

*Primary Examiner* — Quan Tra
(74) *Attorney, Agent, or Firm* — Winston Hsu

(57) ABSTRACT

The present invention provides a reference voltage buffer comprises a reference voltage generator, a first operational amplifier, a first transistor, a first group of resistors, a first load, a second transistor, a second group of resistors and a second load. In the reference voltage buffer, the first load and the second load use active device to increase the settling time, and the first load, the second load and the reference voltage generator of the reference voltage buffer are resigned to have the same characteristics in response to the temperature variation to overcome the PVT issue, and the first load and the second load of the reference voltage buffer use the open-loop design to have large full-scale of the output reference voltages.

14 Claims, 3 Drawing Sheets

(56) References Cited

U.S. PATENT DOCUMENTS

| | | |
|---|---|---|
| 10,203,251 B2* | 2/2019 | Chiang .................. G01K 7/01 |
| 2008/0191792 A1 | 8/2008 | Ogiwara |
| 2011/0227538 A1 | 9/2011 | Li |
| 2013/0027007 A1* | 1/2013 | Zhong .................. H03F 1/086 |
| | | 323/265 |
| 2013/0162227 A1 | 6/2013 | Kodama |
| 2016/0054183 A1 | 2/2016 | Yayama |
| 2017/0160145 A1 | 6/2017 | Chiang |
| 2019/0238125 A1* | 8/2019 | Chen .................. G11C 27/02 |

FOREIGN PATENT DOCUMENTS

| | | |
|---|---|---|
| TW | 201032016 A1 | 9/2010 |
| TW | 201349742 A | 12/2013 |
| TW | 201535346 A | 9/2015 |
| TW | I643049 B | 12/2018 |

OTHER PUBLICATIONS

Young-Deuk Jeon , "A 9.15mW 0.22mm2 10b 204MS/s Pipelined SAR ADC in 65nm CMOS", IEEE, 2010.

Prakash Harikumar , "Design of a Reference Voltage Buffer for a 10-bit 50 MS/s SAR ADC in 65 nm CMOS", IEEE, 2015.

* cited by examiner

US 11,233,513 B2

REFERENCE VOLTAGE BUFFER WITH SETTLING ENHANCEMENT

CROSS REFERENCE TO RELATED APPLICATIONS

This application claims the priority of U.S. Provisional Application No. 62/930,696, filed on Nov. 5, 2019, which is included herein by reference in its entirety.

BACKGROUND

An analog-to-digital converter (ADC) generally has a reference voltage buffer for providing a plurality of reference voltages to comparators within a quantizer. With the development of advanced semiconductor processes and a clock signal becomes faster, the reference voltage buffer suffers many design problems such as settling issue, signal quality and process-voltage-temperature (PVT) variation. Specifically, when the comparators within the quantizer starts to use the reference voltages to sample input signals, the reference voltages may suddenly drop, and the reference voltage buffer requires a settling time to make the reference voltages back to original levels. Because a frequency of the clock signal and the sampling rate becomes faster, the settling time of the reference voltage buffer needs to be designed shorter to provide stable reference voltages. In addition, considering noise tolerance of signals processed by the quantizer, a full scale of the reference voltage buffer is preferred to be designed larger, that is a difference between a highest reference voltage and a lowest reference voltage should be designed as large as possible. However, large full-scale design may cause reference voltages unstable. Furthermore, if the reference voltage buffer uses active devices as loads to generate reference voltages, the reference voltage buffer may suffer PVT issue and the reference voltage becomes unstable, causing a problem to the quantizer.

SUMMARY

It is therefore an objective of the present invention to provide a reference voltage buffer having faster settling time and large full-scale, and the reference voltage buffer can provide suitable reference voltages to a quantizer even if levels of the reference voltages change due to PVT issue, to solve the above-mentioned problems.

According to one embodiment of the present invention, a reference voltage buffer comprises a reference voltage generator, a first operational amplifier, a first transistor, a first group of resistors, a first load, a second transistor, a second group of resistors and a second load. The reference voltage generator is configured to generate a reference voltage. The first operational amplifier is configured to receive the reference voltage and a signal to generate a control signal. The first transistor is configured to be controlled by the control signal. The first group of resistors is coupled to the first transistor, wherein the signal is generated from an internal node of the first group of resistors. The first load is coupled to the first group of resistors. The second transistor is configured to be controlled by the control signal. The second group of resistors is coupled to the second transistor. The second load is coupled to the second group of resistors. In addition, the reference voltage generator, the first load and the second load have same characteristics in response to temperature variation.

According to another embodiment of the present invention, a reference voltage buffer comprises a reference voltage generator, a first operational amplifier, a first transistor, a first group of resistors, a first load, a second transistor, a second group of resistors and a second load. The reference voltage generator is configured to generate a reference voltage. The first operational amplifier is configured to receive the reference voltage and a signal to generate a control signal. The first transistor is configured to be controlled by the control signal. The first group of resistors is coupled to the first transistor, wherein the signal is generated from an internal node of the first group of resistors. The first load is coupled to the first group of resistors. The second transistor is configured to be controlled by the control signal. The second group of resistors is coupled to the second transistor. The second load is coupled to the second group of resistors. In addition, each of the first load and the second load comprises an active device.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
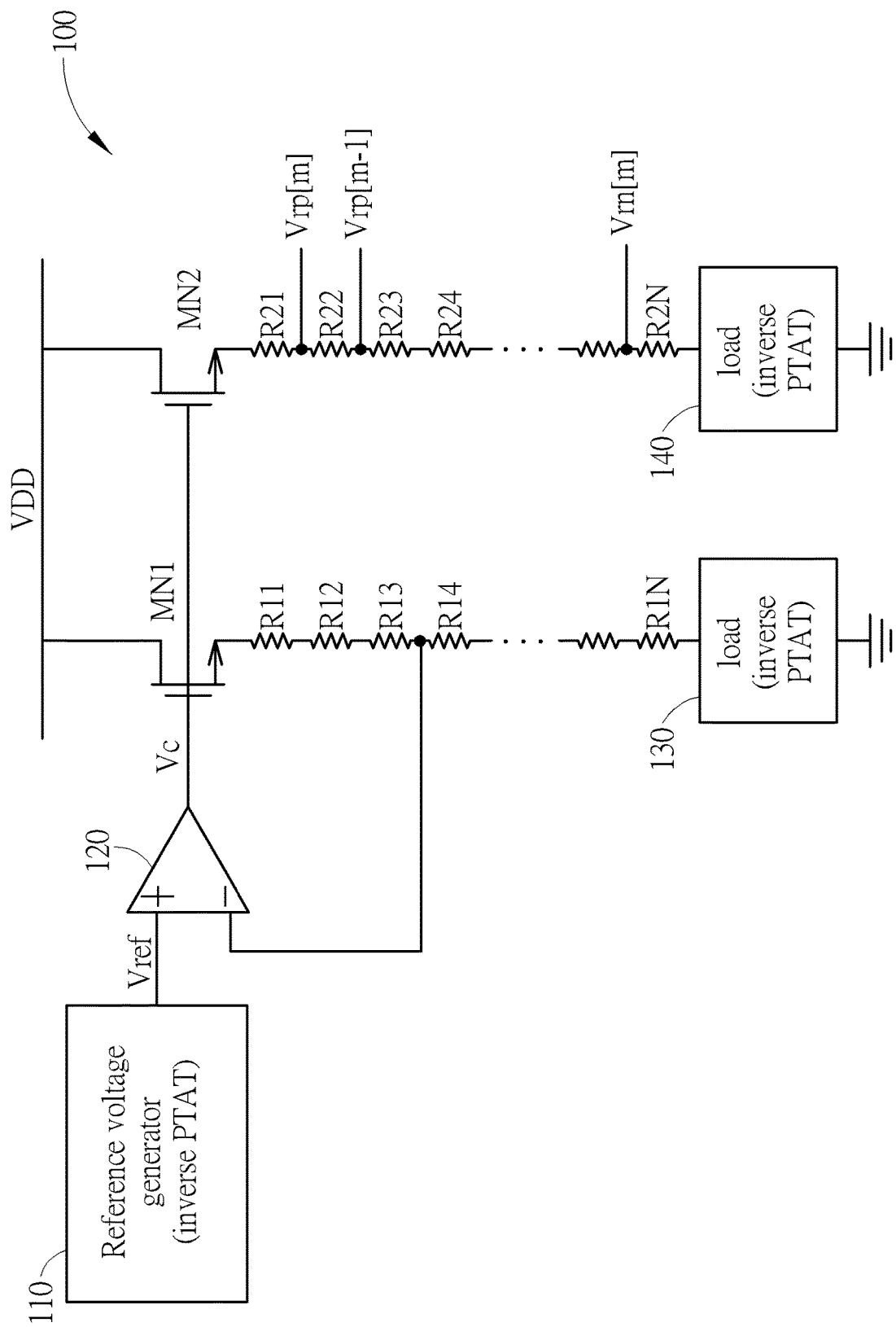
FIG. 1 is a diagram illustrating a reference voltage buffer according to one embodiment of the present invention.

FIG. 1 is a diagram illustrating a reference voltage buffer 100 according to one embodiment of the present invention. As shown in FIG. 1, the reference voltage buffer 100 comprises a reference voltage generator 110, an operational amplifier 120, a first transistor MN1, a first group of resistors comprising resistors R11-R1N, a load 130, a second transistor MN2, a second group of resistors comprising resistors R21-R2N and a load 140. The operational amplifier 120 has a positive input terminal, a negative input terminal and an output terminal, wherein the positive input terminal is coupled to the reference voltage generator 110, the negative input terminal is coupled to a node within the first group of resistors (in this embodiment, the negative input terminal is coupled to the node between the resistors R13 and R14), and the output terminal is configured to output a control signal Vc to the first transistor MN1 and the second transistor MN2. The transistor MN1 is implemented by using an N-type metal-oxide-semiconductor (NMOS) having a drain electrode, a source electrode and a gate electrode, wherein the drain electrode is coupled to a supply voltage VDD, a source electrode is coupled to the resistor R11, and the gate electrode receives the control signal Vc generated by the operational amplifier 120. The resistors R11-R1N are connected in series, wherein the resistor R11 is coupled to the source electrode of the transistor MN1, and the resistor R1N is coupled to the load 130. The transistor MN2 is implemented by using an NMOS having a drain electrode, a source electrode and a gate electrode, wherein the drain electrode is coupled to the supply voltage VDD, a source electrode is coupled to the resistor R21, and the gate electrode receives the control signal Vc generated by the operational amplifier 120. The resistors R21-R2N are connected in series, wherein the resistor R21 is coupled to the source electrode of the transistor MN2, and the resistor R2N is coupled to the load 140.

During operation of the reference voltage buffer 100, the reference voltage generator 110 generates a reference voltage Vref to the positive terminal of the operational amplifier 120, and the operational amplifier 120 compares the reference voltage Vref with a signal from the first group of resistors to generate the control signal to the gate terminals of the transistors MN1 and MN2. By using the close-loop structure of the operational amplifier 120 and the transistor MN1, a level of the node between the resistor R13 and R14 can be controlled to be equal to the reference voltage Vref. In addition, the transistor MN2, the second group of the resistors and the load 140 are replicas of the transistor MN1, the first group of the resistors and the load 130, respectively, and the second group of the resistors are configured to generate a plurality of output reference voltages such as Vrp[m], Vrp[m−1], . . . , Vrn[m] shown in FIG. 1.

In the reference voltage buffer 100 shown in FIG. 1, because the operational amplifier 120, the transistor MN1 and the first group of the resistors form a closed-loop, and the transistor MN2 and the second group of resistors are used to provide the output reference voltages Vrp[m], Vrp [m−1], . . . , Vrn[m] to following circuits, the generation of the output reference voltages Vrp[m], Vrp[m−1], . . . , Vrn[m] will be more stable. Specifically, when the following circuits use the output reference voltages Vrp[m], Vrp[m−1], . . . , Vrn[m], the output reference voltages Vrp[m], Vrp[m−1], . . . , Vrn[m] may suddenly drop. At this time, because the operational amplifier 120 still provide the stable control signal Vc to the gate electrode of the transistor MN2, the output reference voltages Vrp[m], Vrp[m−1], . . . , Vrn[m] can immediately go back to original levels, that is the reference voltage buffer 100 has a better settling time. In addition, when the reference voltage buffer 100 is used in an ADC with fast sampling rate, the settling time needs to be designed shorter to stabilize the output reference voltages. In this embodiment, the loads 130 and 140 uses active device such as NMOS or P-type metal-oxide-semiconductor (PMOS) to make the settling time shorter.

Although the settling time of the reference voltage buffer 100 can be improved by using the loads 130 and 140 having active devices, the active device maybe easily suffer the PVT issue, that is the output reference voltages Vrp[m], Vrp[m−1], . . . , Vrn[m] may be easily influenced by the PVT variations. To solve this problem, the load 130, the load 140 and the reference voltage generator 110 are designed to have the same characteristics for the PVT variation, that is if the temperature variation makes the load 130/140 have larger dropout voltage (e.g. the voltage at a node between the resistor R1N and the load 130 becomes higher), the temperature variation also makes the reference voltage generator 110 generate the reference voltage Vref with greater level. For example, each of the loads 130 and 140 is an inverse proportional to absolute temperature (inverse PTAT) load, and the reference voltage generator 100 is an inverse PTAT reference voltage generator.

By designing the loads 130 and 140 and the reference voltage generator 110 to have the same characteristics in response to the PVT variation, the output reference voltages Vrp[m], Vrp[m−1], . . . , Vrn[m] are appropriate for the following comparators of the quantizer even if absolute values of the output reference voltages Vrp[m], Vrp[m−1], . . . , Vrn[m] change. Specifically, each of the comparators within the quantizer receives two output reference voltages generated by the reference voltage buffer 100, for example, one comparator uses the output reference voltages Vrp[m] and Vrn[m], another comparator uses the output reference voltages Vrp[m−1] and Vrn[m−1], . . . , and so on. When the temperature variation makes the load 140 have larger dropout voltage (that is voltage level of the output reference voltage Vrn[m] increases), the reference voltage Vref provided by the reference voltage generator increases to make the node between the resistors R13 and R14 have higher voltage level, and the node between the resistors R23 and R24 also has higher voltage level accordingly. Therefore, since all the output reference voltages have the increased voltage levels, the voltage difference between the two output reference voltages such as Vrp[m] and Vrn[m] will remain stable, and the comparators can work well.

Figure 2:
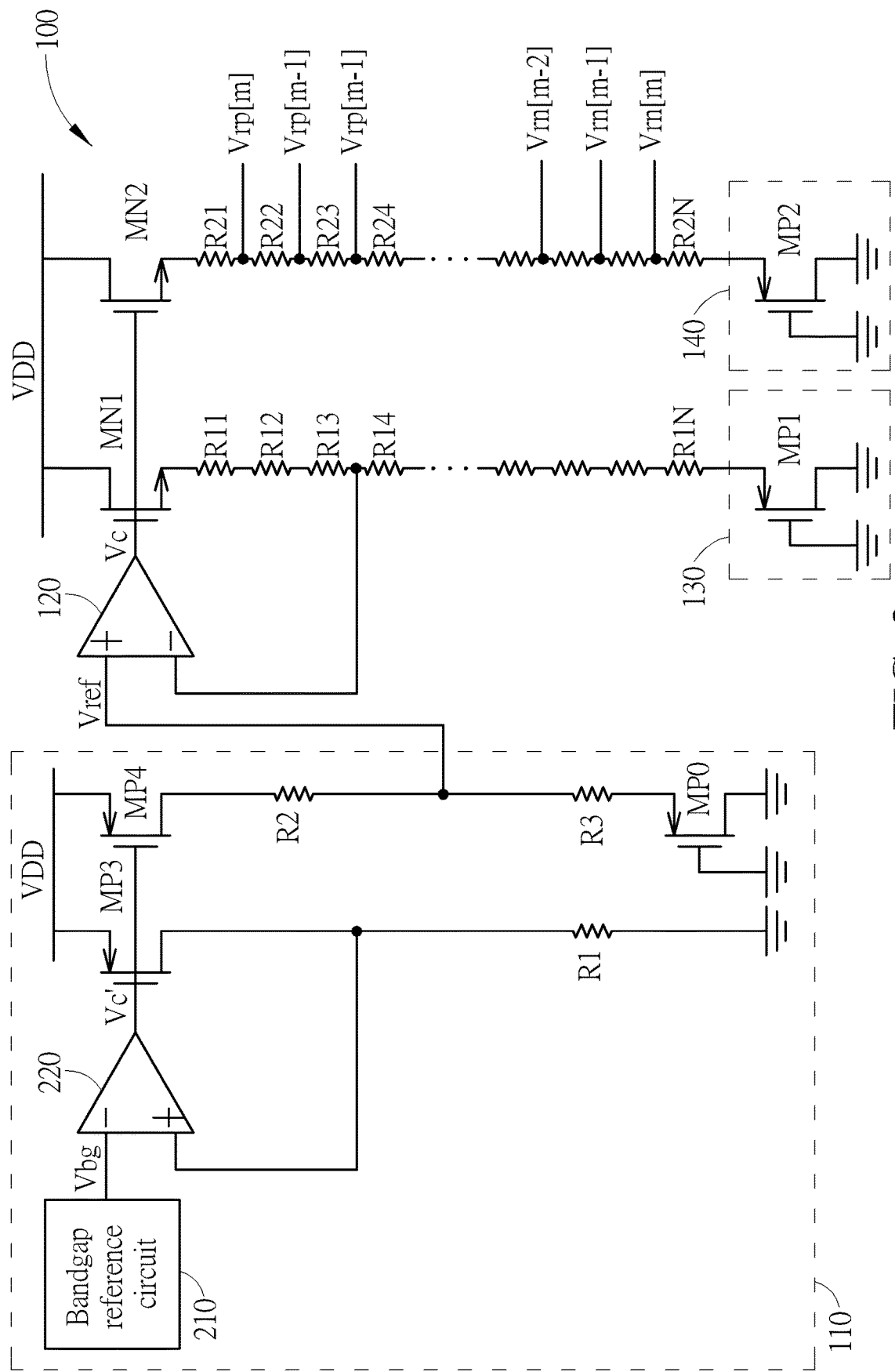
FIG. 2 shows detailed circuits of the reference voltage buffer according to one embodiment of the present invention.

FIG. 2 shows detailed circuits of the reference voltage buffer 100 according to one embodiment of the present invention. As shown in FIG. 2, the load 130 is implemented by a PMOS MP1 having a gate electrode, a source electrode and a drain electrode, wherein the source electrode is coupled to the resistor R1N, the drain electrode and the gate electrode are coupled to a ground voltage. The load 140 is implemented by a PMOS MP2 having a gate electrode, a source electrode and a drain electrode, wherein the source electrode is coupled to the resistor R2N, the drain electrode and the gate electrode are coupled to the ground voltage. The reference voltage generator 110 comprises a bandgap reference circuit 210, an operational amplifier 220, transistors MP0, MP3 and MP4, and resistors R1, R2 and R3. The operational amplifier 220 has a positive input terminal, a negative input terminal and an output terminal, wherein the negative input terminal receives a bandgap reference voltage Vbg generated by the bandgap reference circuit 210, the positive input terminal is coupled to a node between the transistor MP3 and the resistor R1, and the output terminal is configured to output a control signal Vc' to the transistors MP3 and MP4. The transistor MP3 is implemented by using a PMOS having a drain electrode, a source electrode and a gate electrode, wherein the source electrode is coupled to the supply voltage VDD, the source electrode is coupled to the resistor R1, and the gate electrode receives the control signal Vc generated by the operational amplifier 220. The transistor MP4 is implemented by using a PMOS having a drain electrode, a source electrode and a gate electrode, wherein the source electrode is coupled to the supply voltage VDD, the source electrode is coupled to the resistor R2, and the gate electrode receives the control signal Vc generated by the operational amplifier 220. The transistor MP0 is implemented by using a PMOS having a drain electrode, a source electrode and a gate electrode, wherein the source electrode is coupled to the resistor R3, and the drain electrode and the gate electrode are connected to the ground. In addition, the node between the resistors R2 and R3 is used to generate the reference voltage Vref to the operational amplifier 120.

In other embodiments, the transistors MP3 and MP4 can be implemented by NMOSs, and/or another resistor may be inserted between the transistor MP3 and the resistor R1.

In the embodiment shown in FIG. 2, because the load 130 and the transistor MP0 have the same characteristics (e.g. both of them are implemented by PMOS), the voltage variation at the source electrode of the transistor MP1 is much similar to the voltage variation at the source electrode of the transistor MP0 in response to the temperature variation, that is the voltage variation at the source electrode of the transistor MP1 is much similar to the voltage variation of the reference voltage Vref. Therefore, the voltage difference between the two output reference voltages such as Vrp[m−2] and Vrn[m−2] will remain stable.

In addition, to enhance noise tolerance, the output reference voltages are preferred to have a large full scale, that is a difference between the highest output reference voltage Vrp[m] and the lowest output reference voltage Vrn[m] should be designed as large as possible. In this embodiment, to lower the voltage of the output reference voltage Vrn[m], the load 130/140 is implemented by the PMOS MP1/MP2 with an open-loop design. By using the open-loop design of the load 130/140, that is no operational amplifier is arranged to receive the voltage at the source electrode to control the gate electrode, the source electrode of the PMOS MP1/MP2 can have the lower voltage level while operating in a saturation region.

Figure 3:
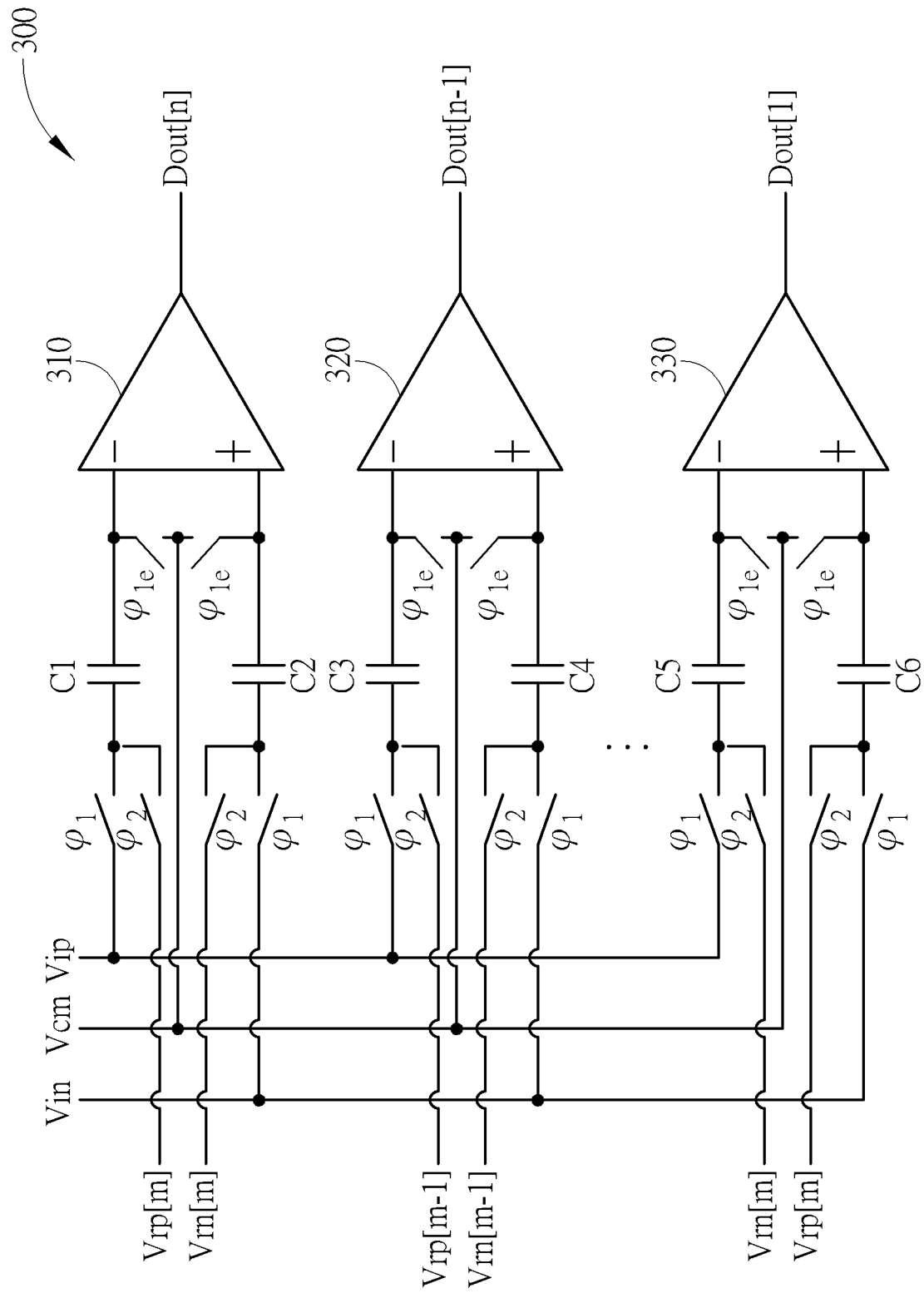
FIG. 3 is a diagram illustrating a quantizer according to one embodiment of the present invention.

FIG. 3 is a diagram illustrating a quantizer 300 according to one embodiment of the present invention. As shown in FIG. 3, the quantizer 300 comprises a plurality of comparators such as 310, 320 and 330, a plurality of capacitors such as C1-C6 and a plurality of switches. In this embodiment, the switches of the quantizer 300 are controlled by control signals ϕ1, ϕ2 and ϕ1e, the comparator 310 is configured to receive input signals Vin and Vip, a common mode signal Vcm and two output reference voltages Vrp[m] and Vrn[m] via the capacitors C1 and C2 and switches to generate a digital output bit Dout[n], the comparator 320 is configured to receive the input signals Vin and Vip, the common mode signal Vcm and two output reference voltages Vrp[m−1] and Vrn[m−1] via the capacitors C3 and C4 and switches to generate a digital output bit Dout[n−1], . . . , and the comparator 330 is configured to receive input signals Vin and Vip, the common mode signal Vcm and two output reference voltages Vrp[m] and Vrn[m] via the capacitors C5 and C6 and switches to generate a digital output bit Dout[1]. When the switches turned on and the comparator 310/3320/330 start to use the output reference voltages, the output reference voltages may suddenly drop. By using the embodiment shown in FIG. 1 or FIG. 2 with faster settling time design, the output reference voltages can immediately be back to the original voltage levels, and the quantizer 300 can always work well.

It is noted that the quantizer 300 is for illustrative purpose only, as long as each comparator within the quantizer 300 uses two output reference voltages, the internal circuits of the quantizer 300 may have different design. In addition, because the present invention focuses on the reference voltage buffer 100 for providing the output reference voltages, further descriptions about the quantizer 300 is omitted here.

Briefly summarized, in the reference voltage buffer of the present invention, the reference voltage buffer uses active loads to increase the settling time, the loads and the reference voltage generator of the reference voltage buffer are resigned to have the same characteristics in response to the temperature variation to overcome the PVT issue, and the loads of the reference voltage buffer use the open-loop design to have large full-scale of the output reference voltages. Therefore, the reference voltage buffer can provide suitable output reference voltages to following circuits with faster settling time.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A reference voltage buffer, comprising:
   a reference voltage generator, configured to generate a reference voltage;
   a first operational amplifier, configured to receive the reference voltage and a signal to generate a control signal;
   a first transistor, configured to be controlled by the control signal;
   a first group of resistors, coupled to the first transistor, wherein the signal is generated from an internal node of the first group of resistors;
   a first load, coupled to the first group of resistors;
   a second transistor, configured to be controlled by the control signal;
   a second group of resistors, coupled to the second transistor, wherein the second group of resistors are configured to generate a plurality of output reference voltages; and
   a second load, coupled to the second group of resistors;
   wherein the reference voltage generator, the first load and the second load have same characteristics in response to temperature variation.

2. The reference voltage buffer of claim 1, wherein each of the first load and the second load comprises an active device.

3. The reference voltage buffer of claim 1, wherein the first load is an inverse proportional to absolute temperature (inverse PTAT) load, the second load is the inverse PTAT load, and the reference voltage generator is an inverse PTAT reference voltage generator.

4. The reference voltage buffer of claim 3, wherein the first load comprises a first P-type metal-oxide-semiconductor (PMOS), and the second load comprises a second PMOS.

5. The reference voltage buffer of claim 4, wherein a source electrode of the first PMOS is coupled to the first group of resistors, a drain electrode and a gate electrode of the first PMOS are coupled to a ground voltage; and a source electrode of the second PMOS is coupled to the second group of resistors, a drain electrode and a gate electrode of the second PMOS are coupled to the ground voltage.

6. The reference voltage buffer of claim 1, wherein the reference voltage generator comprises:
   a bandgap reference generator, configured to generate a bandgap reference voltage;
   a second operational amplifier, configured to receive the bandgap reference voltage and another signal to generate another control signal;
   a third transistor, configured to be controlled by the other control signal;
   a first resistor, coupled to the first transistor;
   a fourth transistor, configured to be controlled by the other control signal;
   a second resistor, coupled to the fourth resistor;
   a third resistor, coupled to the second resistor; and
   a third load, coupled to the third resistor;
   wherein the first load, the second load and the third load have same characteristics in response to temperature variation.

7. The reference voltage buffer of claim 6, wherein each of the first load, the second load and the third load is the inverse PTAT load.

8. The reference voltage buffer of claim 7, wherein the first load comprises a first PMOS, and the second load comprises a second PMOS, and the third load comprises a third PMOS.

9. The reference voltage buffer of claim 8, wherein a source electrode of the first PMOS is coupled to the first group of resistors, a drain electrode and a gate electrode of the first PMOS are coupled to a ground voltage; a source electrode of the second PMOS is coupled to the second group of resistors, a drain electrode and a gate electrode of the second PMOS are coupled to the ground voltage; and a source electrode of the third PMOS is coupled to the third resistor, a drain electrode and a gate electrode of the third PMOS are coupled to the ground voltage.

10. A reference voltage buffer, comprising:
a reference voltage generator, configured to generate a reference voltage;
a first operational amplifier, configured to receive the reference voltage and a signal to generate a control signal;
a first transistor, configured to be controlled by the control signal;
a first group of resistors, coupled to the first transistor, wherein the signal is generated from an internal node of the first group of resistors;
a first load, coupled to the first group of resistors;
a second transistor, configured to be controlled by the control signal;
a second group of resistors, coupled to the second transistor, wherein the second group of resistors are configured to generate a plurality of output reference voltages; and
a second load, coupled to the second group of resistors;
wherein each of the first load and the second load comprises an active device; and the second transistor, the second group of resistors and the second load are replicas of the first transistor, the first group of resistors and the first load, respectively;
wherein the reference voltage generator comprises:
a bandgap reference generator, configured to generate a bandgap reference voltage;
a second operational amplifier, configured to receive the bandgap reference voltage and another signal to generate another control signal;
a third transistor, configured to be controlled by the other control signal;
a first resistor, coupled to the first transistor;
a fourth transistor, configured to be controlled by the other control signal;
a second resistor, coupled to the fourth resistor;
a third resistor, coupled to the second resistor; and
a third load, coupled to the third resistor;
wherein each of the first load, the second load and the third load has the active device.

11. The reference voltage buffer of claim 10, wherein the first load comprises a first P-type metal-oxide-semiconductor (PMOS), and the second load comprises a second PMOS.

12. The reference voltage buffer of claim 11, wherein a source electrode of the first PMOS is coupled to the first group of resistors, a drain electrode and a gate electrode of the first PMOS are coupled to a ground voltage; and a source electrode of the second PMOS is coupled to the second group of resistors, a drain electrode and a gate electrode of the second PMOS are coupled to the ground voltage.

13. The reference voltage buffer of claim 10, wherein the first load comprises a PMOS, the second load comprises a second PMOS, and the third load comprises a third PMOS.

14. The reference voltage buffer of claim 13, wherein a source electrode of the first PMOS is coupled to the first group of resistors, a drain electrode and a gate electrode of the first PMOS are coupled to a ground voltage; a source electrode of the second PMOS is coupled to the second group of resistors, a drain electrode and a gate electrode of the second PMOS are coupled to the ground voltage; and a source electrode of the second PMOS is coupled to the third resistor, a drain electrode and a gate electrode of the third PMOS are coupled to the ground voltage.

* * * * *